(12) United States Patent
Li et al.

(10) Patent No.: US 11,984,397 B2
(45) Date of Patent: May 14, 2024

(54) SEMICONDUCTOR STRUCTURE

(71) Applicant: NANYA TECHNOLOGY CORPORATION, New Taipei (TW)

(72) Inventors: Wei-Zhong Li, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 402 days.

(21) Appl. No.: 17/456,562

(22) Filed: Nov. 24, 2021

(65) Prior Publication Data

US 2023/0163068 A1 May 25, 2023

(51) Int. Cl.
*H01L 23/525* (2006.01)
*H10B 20/20* (2023.01)

(52) U.S. Cl.
CPC ......... *H01L 23/5256* (2013.01); *H10B 20/20* (2023.02)

(58) Field of Classification Search
None
See application file for complete search history.

(56) References Cited

U.S. PATENT DOCUMENTS

| | | | | |
|---|---|---|---|---|
| 9,443,860 | B1 * | 9/2016 | Sung | G11C 17/16 |
| 2008/0101146 | A1 * | 5/2008 | Paak | H10B 20/20 |
| | | | | 257/E21.666 |
| 2009/0283814 | A1 * | 11/2009 | Chen | H10B 20/20 |
| | | | | 257/E27.102 |
| 2010/0244144 | A1 * | 9/2010 | Hsueh | H10B 20/20 |
| | | | | 257/E23.149 |
| 2016/0049366 | A1 * | 2/2016 | Mikalo | H01L 23/5256 |
| | | | | 257/529 |
| 2018/0061846 | A1 * | 3/2018 | Gan | H01L 29/7851 |
| 2019/0393231 | A1 * | 12/2019 | Sreeramaneni | H01L 23/5256 |
| 2021/0343695 | A1 * | 11/2021 | Chiu | H01L 23/528 |
| 2023/0064518 | A1 * | 3/2023 | Liu | H01L 23/5256 |

* cited by examiner

*Primary Examiner* — Evren Seven
(74) *Attorney, Agent, or Firm* — CKC & Partners Co., LLC

(57) ABSTRACT

A semiconductor structure includes a substrate, first and second transistors, first and second fuses, a contact structure, and a dielectric layer. The substrate has first and second device regions, and a fuse region. The first and second transistors are respectively above the first and second device regions. The first fuse is electrically connected to the first transistor and includes a first fuse active region having first and second portions. The second fuse is electrically connected to the second transistor and includes a second fuse active region having third and fourth portions. The contact structure interconnects the second portion and the third portion, wherein the first portion and the fourth portion are on opposite sides of the contact structure. The dielectric layer is between the contact structure and the fuse region of the substrate.

15 Claims, 5 Drawing Sheets

SEMICONDUCTOR STRUCTURE

BACKGROUND

Technical Field

The present disclosure relates to a semiconductor structure.

Description of Related Art

With the rapid growth of electronic industry, the development of integrated circuits (ICs) has achieved high performance and miniaturization. Technological advances in IC materials and design have produced generations of ICs where each generation has smaller and more complex circuits than the previous generation.

As the number of electronic devices on single chips rapidly increases, three-dimensional (3D) integrated circuit layouts, or stacked chip designs, have been utilized for certain semiconductor structures in an effort to overcome the feature size and density limitations associated with 2D layouts. However, the feature size and density of the semiconductor structures are still needed to be improved.

SUMMARY

One aspect of the present disclosure is a semiconductor structure.

According to some embodiments of the present disclosure, a semiconductor structure includes a substrate, a first transistor, a second transistor, a first fuse, a second fuse, a contact structure, and a dielectric layer. The substrate has a first device region, a second device region, and a fuse region. The first transistor is above the first device region of the substrate. The second transistor is above the second device region of the substrate. The first fuse is electrically connected to the first transistor and in the fuse region, and the first fuse includes a first fuse active region having a first portion and a second portion. The second fuse is electrically connected to the second transistor and in the fuse region, and the second fuse includes a second fuse active region having a third portion and a fourth portion. The contact structure interconnects the second portion of the first fuse active region and the third portion of the second fuse active region, wherein the first portion of the first fuse active region and the fourth portion of the second fuse active region are on opposite sides of the contact structure. The dielectric layer is between the contact structure and the fuse region of the substrate.

In some embodiments, the first portion of the first fuse active region and the third portion of the second fuse active region are on the same side of the contact structure.

In some embodiments, the first fuse partially overlaps with the second fuse.

In some embodiments, wherein a distance between the first fuse and the second fuse is in a range of about 0.5 um to about 0.6 um.

In some embodiments, the semiconductor structure further includes a first contact and a second contact. The first contact is above the first portion of the first fuse active region. The second contact is above the fourth portion of the second fuse active region.

In some embodiments, the first contact is misaligned to the second contact.

In some embodiments, the first contact is misaligned to the third portion of the second fuse active region.

In some embodiments, a distance between the first transistor and the first fuse is in a range of about 2 um to about 3 um.

In some embodiments, the dielectric layer is directly on the second portion of the first fuse active region and the third portion of the second fuse active region.

In some embodiments, the semiconductor structure further includes a conductive structure above the first transistor and the first fuse such that the first fuse is electrically connected to the first transistor.

In some embodiments, the semiconductor structure further includes an isolation structure in the substrate.

In some embodiments, the first transistor further includes source/drain regions and a gate structure between the source/drain regions.

In some embodiments, the semiconductor structure further includes a gate dielectric layer between the gate structure and the first device region of the substrate.

In some embodiments, a top surface of the contact structure is upper than a top surface of the gate structure of the first transistor.

In some embodiments, the semiconductor structure further includes a contact above the first device region of the substrate and adjacent to the gate structure.

In the aforementioned embodiments, since the contact structure interconnects the second portion of the first fuse active region and the third portion of the second fuse active region, a feature size of the semiconductor structure can be decreased, thereby increasing the integration density. As a result, the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
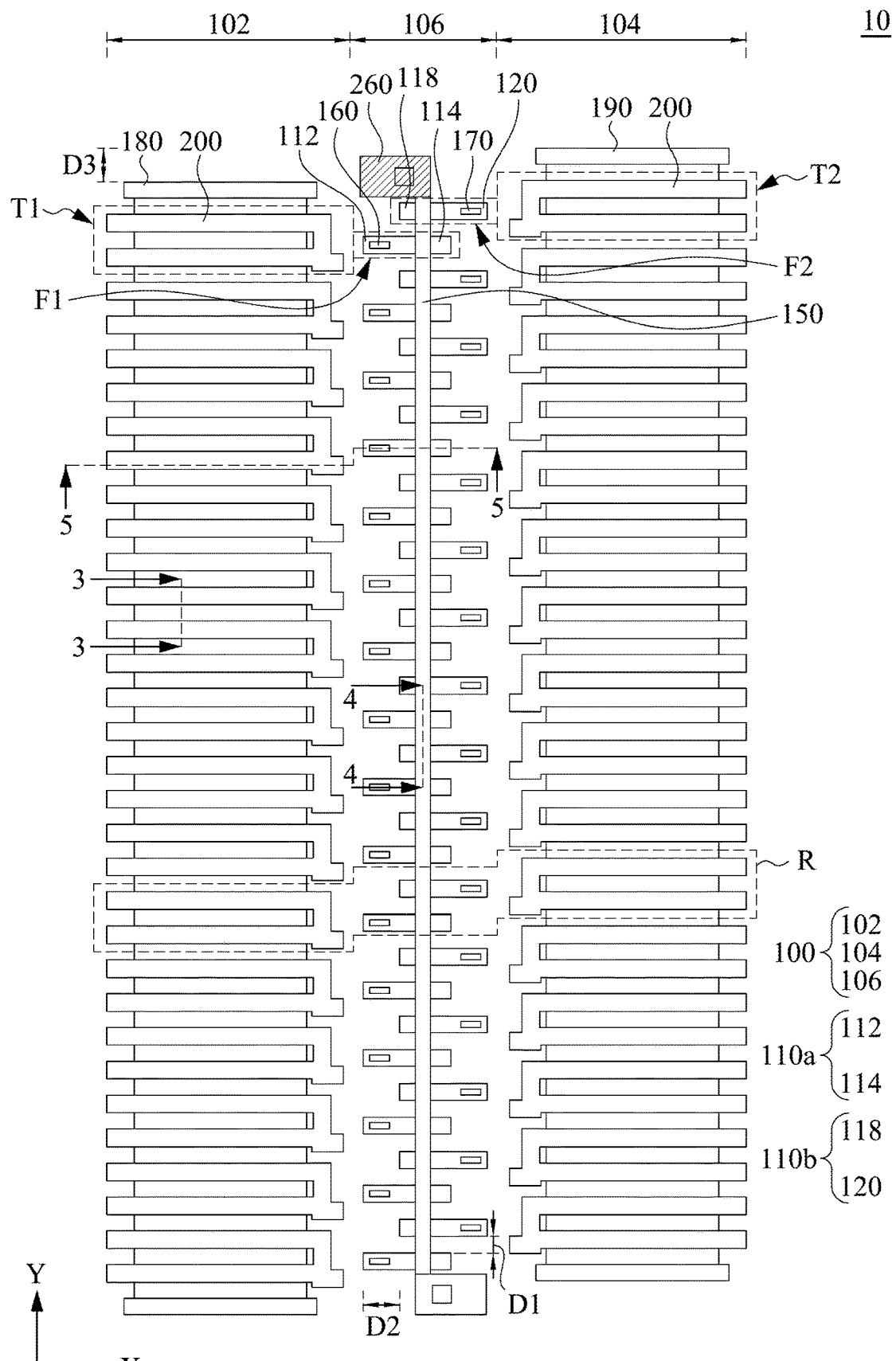
FIG. 1 is a top view of a layout of a semiconductor structure in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
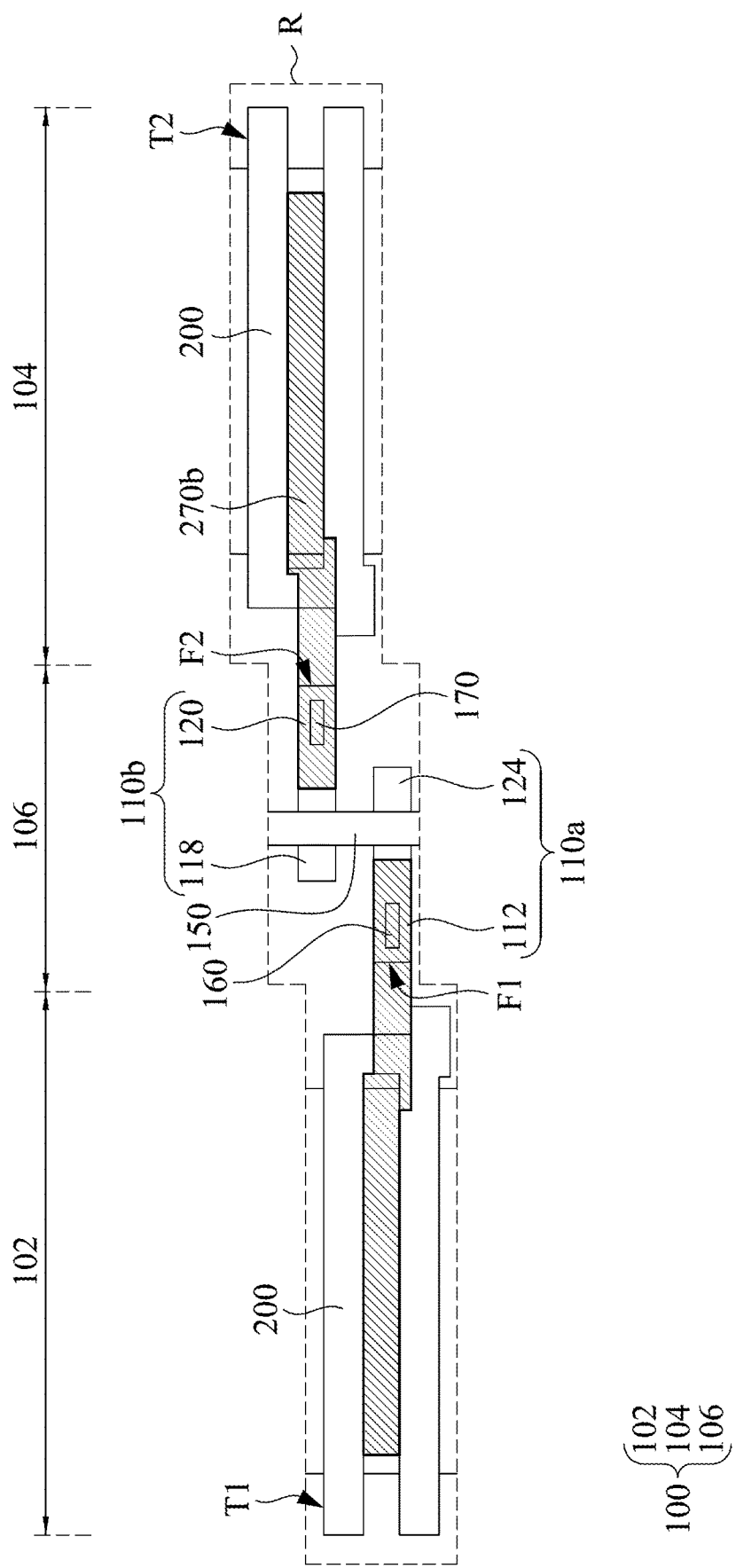
FIG. 2 shows a partially enlarged view of FIG. 1.

FIG. 1 is a top view of a layout of a semiconductor structure 10 in accordance with some embodiments of the present disclosure, and FIG. 2 shows a partially enlarged view of FIG. 1. Referring to FIG. 1 and FIG. 2, a semiconductor structure 10 includes a substrate 100, first transistors T1, second transistors T2, first fuses F1, second fuses F2, a contact structure 150, and a dielectric layer 220 (as will be discussed below with respect to FIGS. 4 and 5). The substrate 100 has a first device region 102, a second device region 104, and a fuse region 106 between the first device region 102 and the second device region 104. The first transistors T1 are disposed above the first device region 102 of the substrate 100, and second transistors T2 are disposed above the second device region 104 of the substrate 100. The first fuses F1 and the second fuses F2 are disposed in the fuse region 106 of the substrate 100. Each of the first fuses F1 is electrically connected to each of the first transistors T1, respectively. Each of the first fuses F1 includes a first fuse active region 110a in the fuse region 106. The first fuse active region 110a has a first portion 112 and a second portion 114. Each of the second fuses F2 is electrically connected to each of the second transistor T2, respectively. Each of the second fuses F2 includes a second fuse active region 110b in the fuse region 106. The second fuse active region 110b includes a third portion 118 and a fourth portion 120. The contact structure 150 interconnects the second portion 114 of the first fuse active region 110a of each of the first fuses F1 and the third portion 118 of the second fuse active region 110b of each of the second fuses F2. The first portion 112 of the first fuse active region 110a and the fourth portion 120 of the second fuse active region 110b are disposed on opposite sides of the contact structure 150. The dielectric layer 220 (see FIGS. 4 and 5) is between the contact structure 150 and the fuse region 106 of the substrate 100. Since the first fuses F1 and the second fuses F2 shares the same contact structure 150 thereon, an area of the fuse region 106 can be decreased and thus a feature size of the semiconductor structure 10 can be decreased, thereby increasing the integration density. As a result, the performance of the semiconductor structure 10 can be improved.

In some embodiments, the semiconductor structure 10 includes a first conductive structure 270a above the first transistor T1 and the first fuse F1 and a second conductive structure 270b above the second transistor T2 and the second fuse F2. The first fuse F1 is electrically connected to the first transistor T1 through the first conductive structure 270a extending above the first device region 102 of the substrate 100 to the fuse region 106 of the substrate 100, and the second fuse F2 is electrically connected to the second transistor T2 through the conductive structure 270b extending above the second device region 104 of the substrate 100 to the fuse region 106 of the substrate 100. The transistors T1 and T2 are configured to both read and write to the fuses F1 and F2. It is noted that FIG. 2 shows a partially enlarged view of a dashed-line region R in FIG. 1 when the conductive structures 270a and 270b are formed above the transistors (transistors T1 and T2) and the fuses (fuses F1 and F2), and the conductive structures 270a and 270b in FIG. 1 are omitted for clarity.

In some embodiments, the first fuses F1 and the second fuses F2 are alternately arranged along in Y-axis direction, in the top view. The contact structure 150 is disposed along Y-axis direction. The first portion 112 of the first fuse active region 110a each of the first fuses F1 and the fourth portion 120 of the second fuse active region 110b of each of the second fuses F2 are on opposite sides of the contact structure 150, while the first portion 112 of the first fuse active region 110a of each of the first fuses F1 and the third portion 118 of the second fuse active region 110b of each of the second fuses F2 are on the same side (e.g., negative direction side in the X-axis direction) of the contact structure 150. Similarly, the first portion 112 of the first fuse active region 110a and the fourth portion 120 of the second fuse active region 110b are on opposite sides of the contact structure 150, while the second portion 114 of the first fuse active region 110a and the fourth portion 120 of the second fuse active region 110b are on the same side (e.g., positive direction side in the X-axis direction) of the contact structure 150. In some embodiments, each of the first fuses F1 partially overlaps with each of the second fuses F2. Specifically, a portion of the second portion 114 of the first fuse active region 110a of each of the first fuses F1 overlaps with (or is aligned to) a portion of the third portion 118 of the second fuse active region 110b of each of the second fuses F2 in Y-axis direction, wherein the portion of the second portion 114 and the portion of the third portion 118 are covered by the contact structure 150.

In some embodiments, a distance D1 between each of the first fuses F1 and each of the second fuses F2 in Y-axis direction is in a range of about 0.5 um to about 0.6 um. If the distance D1 is less than about 0.5 um, the space between the first and second fuses F1 and F2 would not be enough for accommodate contacts; if the distance D1 is greater than about 0.6 um, the area of the fuse region 106 would be increased. In some embodiments, a distance D2 between the first portion 112 of the first fuse active region 110a of each of the first fuses F1 and the third portion 118 of the second fuse active region 110b of each of the second fuses F2 in X-axis direction is in a range of about 0.2 um to about 0.3 um. If the distance D2 is less than about 0.2 um, the space above the first fuses F1 would not be enough for accommodate contacts (e.g., first contact 160 and second contact 170) thereon; if the distance D2 is greater than about 0.3 um, a length of the first portion 112 of the first fuse active region 110a of each of the first fuses F1 would be too large and thus the resistance of the first fuses F1 and also the area of the fuse region 106 would be increased.

In some embodiments, the first portion 112 of the first fuse active region 110a of each of the first fuses F1 is closer to the first transistor T1 than the third portion 118 of the second fuse active region 110b of each of the second fuses F2, and the fourth portion 120 of the second fuse active region 110b of each of the second fuses F2 is closer to the second transistor T2 than the second portion 114 of the first fuse active region 110a of each of the first fuses F1.

In some embodiments, the semiconductor structure 10 further includes a first contact 160 above the first portion 112 of the first fuse active region 110a of each of the first fuses F1 and a second contact 170 above the fourth portion 120 of the second fuse active region 110b of each of the second fuses F2. The first contact 160 is misaligned to the second contact 170. In other words, the first contact 160 and the second contact 170 on opposite sides with respect to the contact structure 150. The first contact 160 is misaligned to the third portion 118 of the second fuse active region 110b, and the second contact 170 is misaligned to the second portion 114 of the first fuse active region 110a. In other words, the first contact 160 does not overlap with the third portion 118 of the second fuse active region 110b, and the second contact 170 does not overlap with the second portion 114 of the first fuse active region 110a.

In some embodiments, the semiconductor structure 10 further includes a first dummy gate 180 above the first device region 102 of the substrate 100 and a second dummy gate 190 above the second device region 104 of the substrate 100. In some embodiments, each of the second transistors T2 is upper than each of the first transistors T1 by a distance D3 in the top view, in which the distance D3 is in a range of about 0.2 um to about 0.3 um (e.g., 0.25 um). In some embodiments, the semiconductor structure 10 further includes a conductive structure 260 configured to program the first fuses F1 and the second fuses F2 by applying a voltage.

In some embodiments, the semiconductor structure 10 has a first length in a range of about 5 um to about 6 um (e.g., 5.45 um) in the X-axis direction and a second length in a range of about 9 um to about 10 um (e.g., 9.64 um) in the Y-axis direction.

Figure 3:
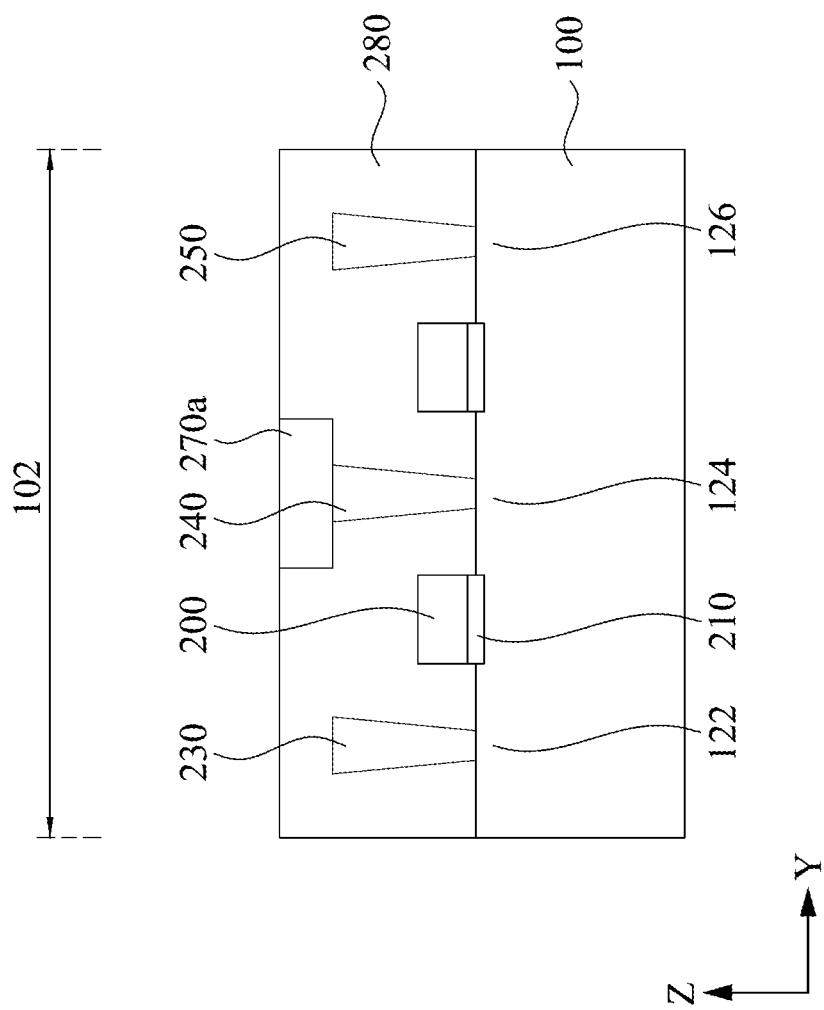
FIG. 3 is a cross-sectional view of the semiconductor structure taken along line 3-3 of FIG. 1.
Figure 4:
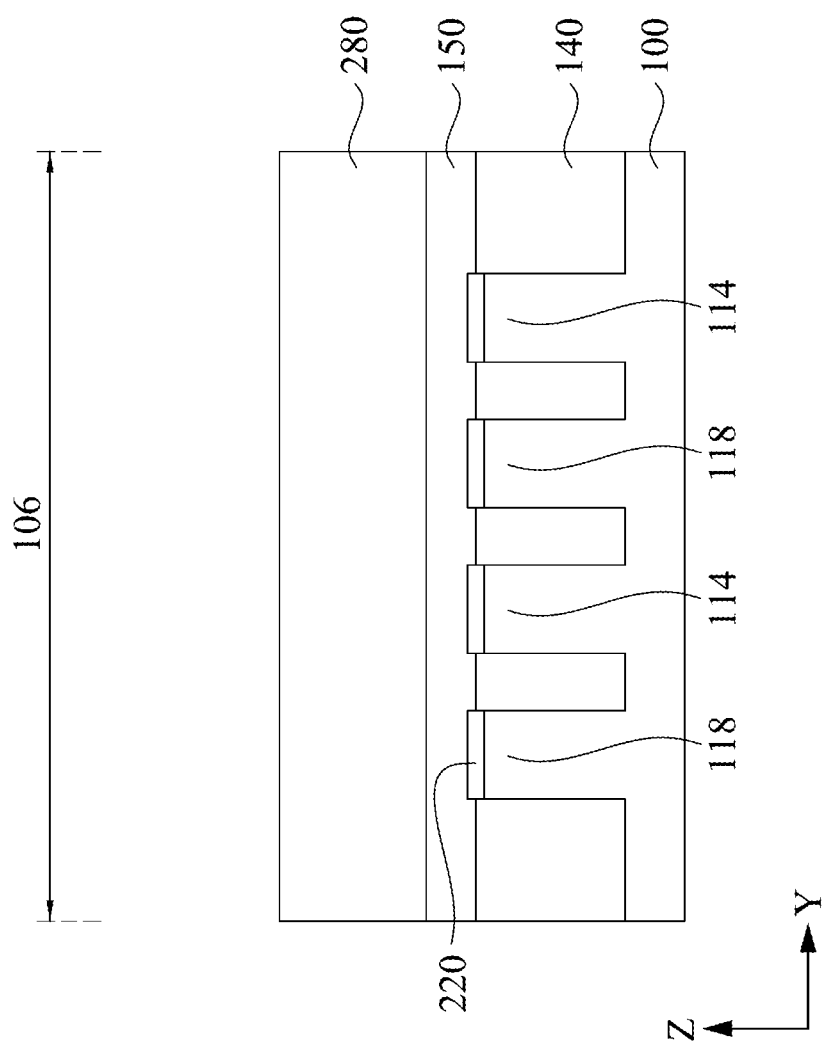
FIG. 4 is a cross-sectional view of the semiconductor structure taken along line 4-4 of FIG. 1.
Figure 5:
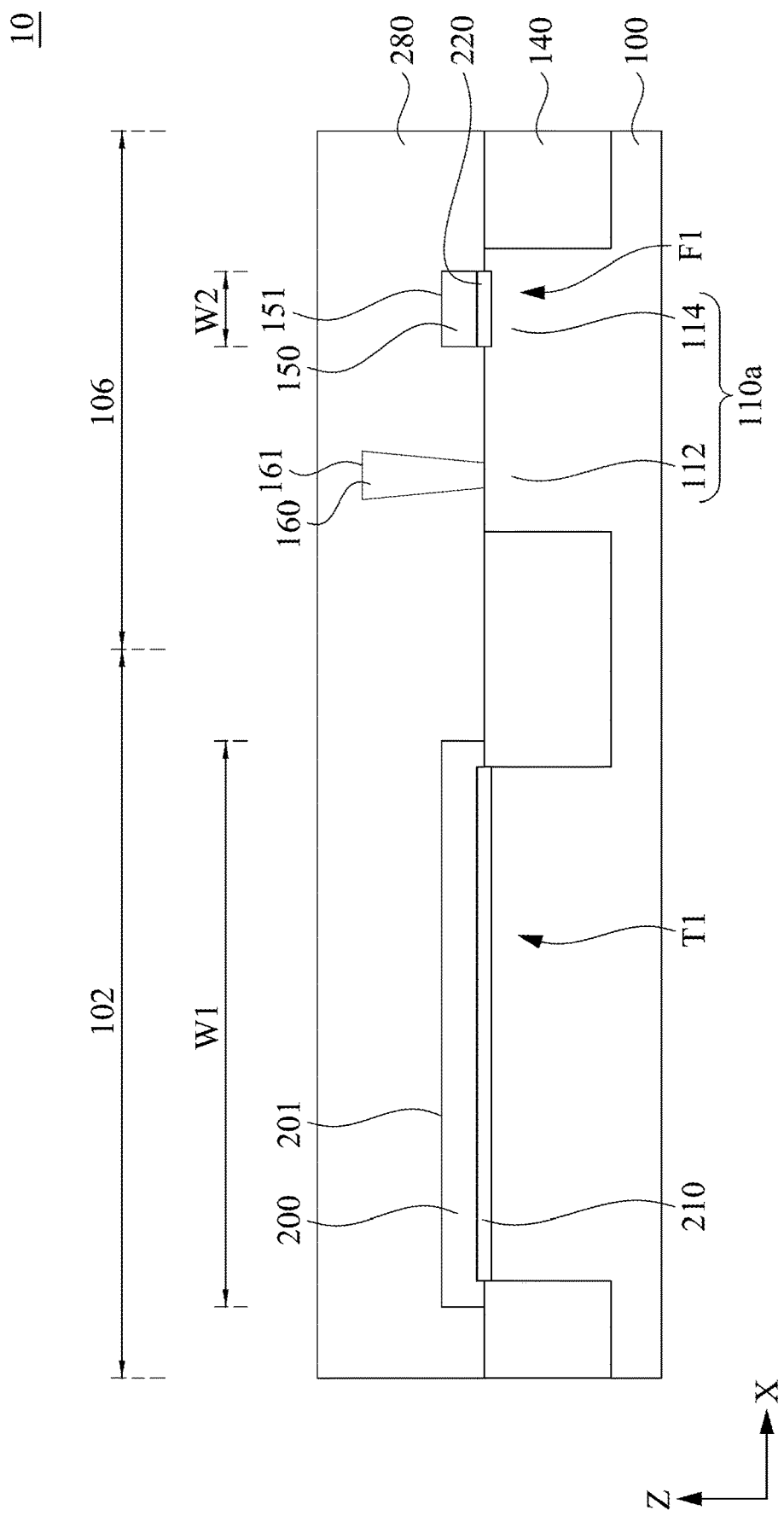
FIG. 5 is a cross-sectional view of the semiconductor structure taken along line 5-5 of FIG. 1.

FIG. 3 is a cross-sectional view (Y-axis is the horizontal axis and Z-axis is the vertical axis) of the semiconductor structure 10 taken along line 3-3 of FIG. 1, FIG. 4 is a cross-sectional view (Y-axis is the horizontal axis and Z-axis is the vertical axis) of the semiconductor structure 10 taken along line 4-4 of FIG. 1, and FIG. 5 is a cross-sectional view (X-axis is the horizontal axis and Z-axis is the vertical axis) of the semiconductor structure 10 taken along line 5-5 of FIG. 1. Referring to FIG. 1 to FIG. 5, the first device region 102, the second device region 104, and the fuse region 106 are adjacent to each other. In some embodiments, the substrate 100 includes silicon. In some other embodiments, the substrate 100 includes another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, as shown in FIG. 3, source/drain regions 122, 124, and 126 are formed in the substrate 100. The source/drain regions 122, 124, and 126 may be formed by doping a top portion of the substrate 100 with N-type dopants such as phosphorous (P), arsenic (As), antimony (Sb), combinations thereof, or the like. Alternatively, the source/drain regions 122, 124, and 126 are formed by doping a top portion of the substrate 100 with P-type dopants such as boron (B), $BF_2$, $BF_3$, combinations thereof, or the like. In some embodiments, the source/drain regions 122 and 124 are referred as source/drain regions of one of the first transistors T1. For example, the source/drain region 122 is the source region of one of the first transistors T1, the source/drain region 124 is the drain region of one of the first transistors T1, and the source/drain region 126 is the source region of another one of the first transistors T1.

In some embodiments, as shown in FIGS. 1, 4, and 5, the semiconductor structure 10 further includes an isolation structure 140 in the substrate 100. The isolation structure 140 is formed to surround the first device region 102, the second device region 104, and the fuse region 106 for proper electrical isolation. In some embodiments, the isolation structure 140 is shallow trench isolation (STI). The formation of the isolation structure 140 may include etching a trench in the substrate 100 and filling the trench by insulator materials such as silicon oxide, silicon nitride, or silicon oxynitride. The filled trench may have a multi-layer structure such as a thermal oxide liner layer with silicon nitride filling the trench. In some embodiments, the isolation structure 140 is created using a process sequence such as: growing a pad oxide, forming a low pressure chemical vapor deposition (LPCVD) nitride layer, patterning STI openings using photoresist and masking, etching trenches in the substrate 100, optionally growing a thermal oxide trench liner to improve the trench interface, filling the trenches with CVD oxide, and using chemical mechanical planarization (CMP) to remove the excessive dielectric layers.

In some embodiments, gate structures 200 are disposed above the first device region 102 and the second device region 104 of the substrate 100, and the contact structure 150 is disposed above the fuse region 106 of the substrate 100. As shown in FIG. 1 and FIG. 3, the first transistor T1 includes the source/drain region 122, the source/drain region 124 and the gate structure 200 between the source/drain regions 122 and 124. In some embodiments, a width W1 of each of the gate structures 200 is greater than a width W2 of the contact structure 150.

In some embodiments, the gate structures 200 and the contact structure 150 are simultaneously formed in a same processing procedure. In some embodiments, the gate structures 200 and the contact structure 150 includes the same material, such as metals, semiconductive materials (e.g., polycrystalline-silicon (poly-Si), poly-crystalline silicon-germanium (poly-SiGe)), or other suitable materials. In some embodiments, the gate structures 200 and the contact structure 150 respectively include work function metal layer(s), capping layer(s), fill layer(s), and/or other suitable layers that are desirable in a metal gate stack. In some embodiments, the fill layer in the gate structures 200 and/or the contact structure 150 may include tungsten (W). The fill layer may be deposited by atomic layer deposition (ALD), physical vapor deposition (PVD), chemical vapor deposition (CVD), or other suitable process.

In some embodiments, the semiconductor structure 10 further includes a gate dielectric layer 210 between each of the gate structures 200 and the first device region 102 of the substrate 100. The gate dielectric layer 210 has a portion in the first device region 102 of the substrate 100 and the remaining portion above the first device region 102 of the substrate 100. In some embodiments, the dielectric layer 220 has a portion in the fuse region 106 of the substrate 100 and the remaining portion above the fuse region 106 of the substrate 100. Specifically, as shown in FIG. 1 and FIG. 4, the dielectric layer 220 is disposed between the contact structure 150 and the third portion 118 of the second fuse active region 110b of the second fuse F2, and between the contact structure 150 and the second portion 114 of the first fuse active region 110a of the first fuse F1. The dielectric layer 220 is directly on the second portion 114 of the first fuse active region 110a and the third portion 118 of the second fuse active region 110b. As shown in FIG. 1 and FIG. 5, the dielectric layer 220 is disposed between the contact structure 150 and the second portion 114 of the first fuse active region 110a of the first fuse F1.

In some embodiments, the gate dielectric layer 210 and the dielectric layer 220 are simultaneously formed in a same processing procedure. In some embodiments, the gate dielectric layer 210 and the dielectric layer 220 include the same material, such as silicon dioxide, silicon nitride, a high-k dielectric material or other suitable material. In various examples, the gate dielectric layer 210 and the dielectric layer 220 are deposited by a thermal oxidation process, an ALD process, a CVD process, a subatmospheric CVD (SACVD) process, a flowable CVD process, a PVD process, or other suitable process.

As shown in FIG. 1 and FIG. 3, the contacts 230-250 are disposed above the first device region 102 of the substrate 100 and adjacent to the gate structures 200. Specifically, the contact 230 is disposed above the source/drain region 122, the contact 240 is disposed above the source/drain region 124, and contact 250 is disposed above the source/drain region 126. The contact 240 is electrically connected to the first conductive structure 270a. As shown in FIG. 1 and FIG. 5, the first contact 160 is disposed above the fuse region 106 of the substrate 100 and adjacent to the contact structure 150. Specifically, the first contact 160 is above the first portion 112 of the first fuse active region 110a, and the contact structure 150 is above the second portion 114 of the first fuse active region 110a. In some embodiments, a top surface 161 of the first contact 160 is upper than the top surface 151 of the contact structure 150.

In some embodiments, as shown in FIGS. 1 and 5, the contact structure 150 has an electrical potential higher than that of the first contact 160 such that a current flows from the contact structure 150 to the first contact 160. In other words, the current flows from the second portion 114 of the first fuse active region 110a to the first portion 112 of the first fuse active region 110a.

In some embodiments, as shown in FIG. 1 to FIG. 5, the contacts 230-250 and the first contact 160 are simultaneously formed in a same processing procedure. The contacts 230-250 and the first contact 160 may include the same material, such as copper (Cu), iron (Fe), aluminum (Al), or other suitable conductive materials. The contacts 230-250 and the first contact 160 may be formed by CVD, PVD, ALD, or other suitable processes.

In some embodiments, the first conductive structure 270a is disposed above the contact 240 and the first contact 160. The first conductive structure 270a is electrically connected to the contact 240 above the first device region 102 of the substrate 100 and the first contact 160 above the fuse region 106 of the substrate 100 such that the first fuse F1 is electrically connected to the first transistor T1 through the first contact 160, the first conductive structure 270a, and the contact 240. The first conductive structure 270a may be made of polysilicon, metals, or other suitable conductive material.

In some embodiments, as shown in FIGS. 1, 2, and 5, the large amount of current may cause the dielectric layer 220 of the first fuse F1 to become blown, such as by electromigration of a conductive material resulting from the large current flowing through the first fuse F1. The first fuse active region 110a may be referred to a first electrode of the first fuse F1, and the contact structure 150 on the first fuse active region 110a may be referred to a second electrode of the first fuse F1. In some embodiments, a breakdown on the dielectric layer 220 between the first electrode (the first fuse active region 110a) and the second electrode (the contact structure 150 on the second portion 114 of the first fuse active region 110a) may occur and forms a short circuit.

In some embodiments, the semiconductor structure 10 further includes an interlayer dielectric (ILD) layer 280 above the substrate 100. The ILD layer 280 may be formed above the substrate 100 to a level above the top surface 201 of each of the gate structures 200 and the top surface 151 of the contact structure 150 such that the gate structures 200 and the contact structure 150 are embedded in. The ILD layer 280 may be formed by chemical vapor deposition (CVD), high-density plasma CVD, spin-on, sputtering, or other suitable methods. In some embodiments, the ILD layer 280 includes silicon oxide, phosphosilicate glass (PSG), borophosphosilicate glass (BPSG), fluorinated silicate glass (FSG), or other suitable materials. In some other embodiments, the ILD layer 280 may include silicon oxy-nitride, silicon nitride, compounds including Si, O, C and/or H (e.g., silicon oxide, SiCOH and SiOC), a low-k dielectric material (dielectric material with dielectric constant less than about 3.9, the dielectric constant of the thermal silicon oxide), or organic materials (e.g., polymers). In some embodiments, a planarization process is performed to remove portions of the ILD layer 280 such that a top surface of the ILD layer 280 is coplanar with top surfaces of the first conductive structure 270a and the second conductive structure 270b. The planarization process may be a chemical mechanical planarization (CMP) process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:

a substrate having a first device region, a second device region, and a fuse region;

a first transistor above the first device region of the substrate;

a second transistor above the second device region of the substrate;

a first fuse electrically connected to the first transistor and in the fuse region, the first fuse comprising a first fuse active region having a first portion and a second portion;

a second fuse electrically connected to the second transistor and in the fuse region, the second fuse comprising a second fuse active region having a third portion and a fourth portion;

a contact structure interconnecting the second portion of the first fuse active region and the third portion of the second fuse active region, wherein the first portion of the first fuse active region and the fourth portion of the second fuse active region are on opposite sides of the contact structure; and a dielectric layer between the contact structure and the fuse region of the substrate.

2. The semiconductor structure of claim 1, wherein the first portion of the first fuse active region and the third portion of the second fuse active region are on the same side of the contact structure.

3. The semiconductor structure of claim 1, wherein the first fuse partially overlaps with the second fuse.

4. The semiconductor structure of claim 1, wherein a distance between the first fuse and the second fuse is in a range of about 0.5 um to about 0.6 um.

5. The semiconductor structure of claim 1, further comprising:
 a first contact above the first portion of the first fuse active region; and
 a second contact above the fourth portion of the second fuse active region.

6. The semiconductor structure of claim 5, wherein the first contact is misaligned to the second contact.

7. The semiconductor structure of claim 5, wherein the first contact is misaligned to the third portion of the second fuse active region.

8. The semiconductor structure of claim 1, wherein a distance between the first transistor and the first fuse is in a range of about 2 um to about 3 um.

9. The semiconductor structure of claim 1, wherein the dielectric layer is directly on the second portion of the first fuse active region and the third portion of the second fuse active region.

10. The semiconductor structure of claim 1, further comprising:
 a conductive structure above the first transistor and the first fuse such that the first fuse is electrically connected to the first transistor.

11. The semiconductor structure of claim 1, further comprising:
 an isolation structure in the substrate.

12. The semiconductor structure of claim 1, wherein the first transistor further comprises:
 source/drain regions; and
 a gate structure between the source/drain regions.

13. The semiconductor structure of claim 12, further comprising:
 a gate dielectric layer between the gate structure and the first device region of the substrate.

14. The semiconductor structure of claim 12, wherein a top surface of the contact structure is upper than a top surface of the gate structure of the first transistor.

15. The semiconductor structure of claim 12, further comprises:
 a contact above the first device region of the substrate and adjacent to the gate structure.

* * * * *